United States Patent [19]
Kinoshita et al.

[11] Patent Number: 5,880,498
[45] Date of Patent: Mar. 9, 1999

[54] SEMICONDUCTOR DEVICE HAVING A NITROGEN DOPED POLYSILICON LAYER

[75] Inventors: Hideyuki Kinoshita; Hiroaki Tsunoda; Hisataka Meguro, all of Yokohama, Japan

[73] Assignee: Kabushiki Kaisha Toshiba, Kawasaki, Japan

[21] Appl. No.: 895,587

[22] Filed: Jul. 16, 1997

[30] Foreign Application Priority Data

Jul. 17, 1996 [JP] Japan .................................... 8-187473

[51] Int. Cl.$^6$ ................................................. H01L 29/788
[52] U.S. Cl. ........................ 257/315; 257/754; 257/755; 257/756
[58] Field of Search .................................... 257/315, 309, 257/381, 382, 371, 412, 636, 637, 647, 622, 756, 758, 759, 760, 754, 755, 768, 769, 767

[56] References Cited

U.S. PATENT DOCUMENTS

| | | | |
|---|---|---|---|
| 5,652,166 | 7/1997 | Sun et al. | 438/229 |
| 5,744,845 | 4/1998 | Sayama et al. | 257/371 |
| 5,747,882 | 5/1998 | Wang et al. | 257/768 |
| 5,804,868 | 9/1998 | Kobayashi et al. | 257/630 |

*Primary Examiner*—Carl Whitehead, Jr.
*Attorney, Agent, or Firm*—Finnegan, Henderson, Farabow, Garrett & Dunner, L.L.P.

[57] ABSTRACT

A semiconductor device comprising, a semiconductor substrate, a first gate insulator film formed on the semiconductor substrate, a floating gate formed on the first gate insulator film, a second insulator film formed on the floating gate, a control gate formed on the second insulator film, and a silicon film doped with nitrogen and an impurity, and interposed between the floating gate and the second gate insulator film and/or between the second gate insulator film and the control gate.

19 Claims, 11 Drawing Sheets

F I G. 6A
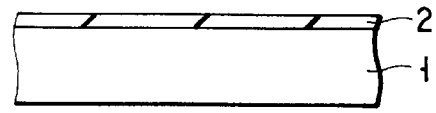
F I G. 6B
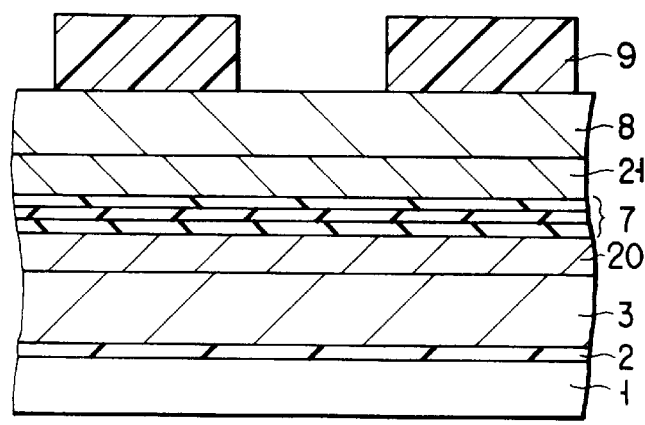
F I G. 6F
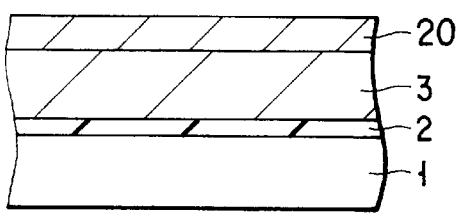
F I G. 6C
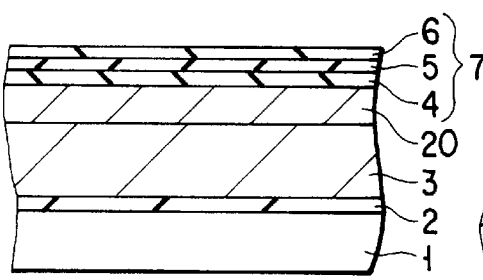
F I G. 6D
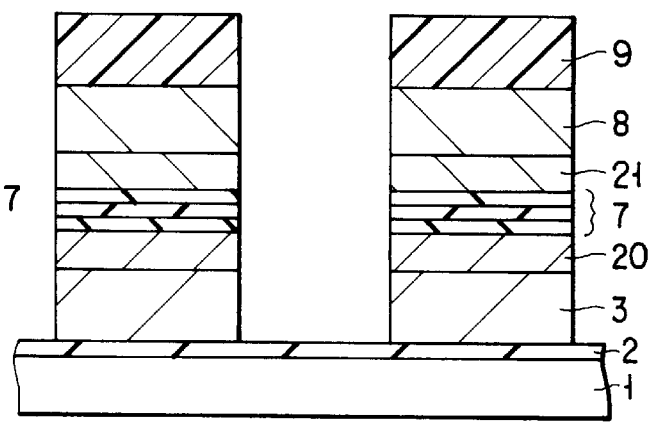
F I G. 6G
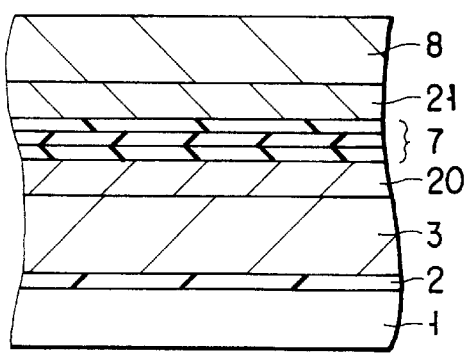
F I G. 6E
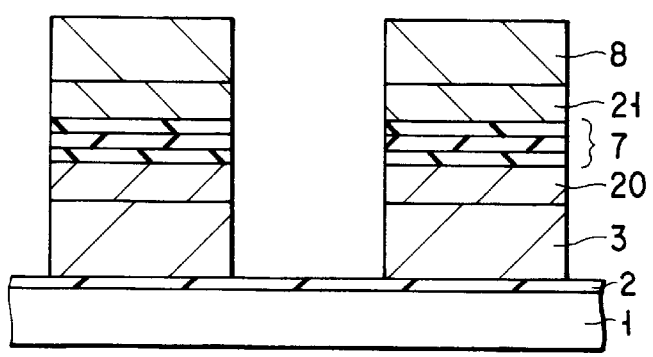
F I G. 6H

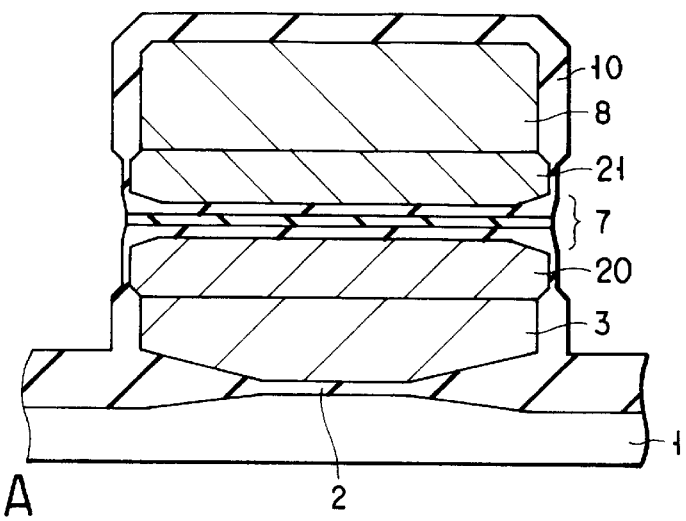
F I G. 7A
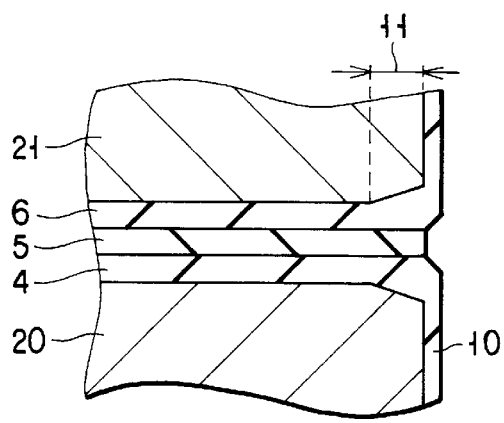
F I G. 7B
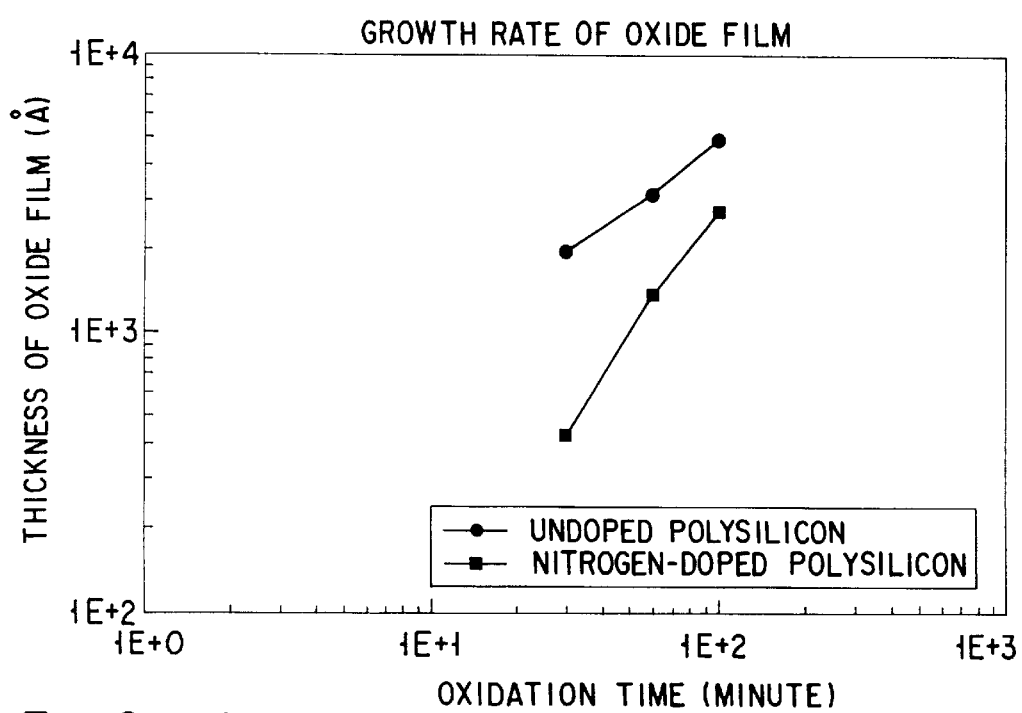
F I G. 8

SEMICONDUCTOR DEVICE HAVING A NITROGEN DOPED POLYSILICON LAYER

BACKGROUND OF THE INVENTION

This invention relates to a semiconductor device such as a nonvolatile memory or a MOS transistor and a method of manufacturing the semiconductor device, and in particular to a flash EEROM and a method of manufacturing the same.

In recent years, there are increasing demands for the higher integration, improved performance and lower power consumption of a semiconductor device. It is very important for meeting these demands to make thinner the gate insulator film of a MOS transistor or the insulator film of a memory cell such as a nonvolatile memory. In order meet this requirement for thinning the gate insulator film, etc., an improvement on the method of manufacturing the gate insulator film or the gate electrode has become necessary.

FIGS. 1A to 1H are cross-sectional views illustrating the method of manufacturing the memory cell portion of a flash EEPROM representing the conventional nonvolatile memory. In the followings, the same constitutional component will be identified by the same reference numeral, thereby omitting the repetition of explanation thereof.

As shown in FIG. 1A, first of all, a field oxide film (not shown) is formed on, for example, a p-type silicon substrate 1 for the purpose of isolation by making use of a selective oxidation method. Then, as shown in FIG. 1B, a silicon dioxide film 2 having a thickness of 10 nm is formed on the silicon dioxide substrate 1 by making use of a thermal oxidation method. This silicon dioxide film 2 is intended to be used as a first gate oxide film or a so-called tunnel oxide film in general.

Then, as shown in FIG. 1C, a polycrystalline silicon film 3 having a thickness of 200 nm and containing phosphorus as an impurity is formed on the silicon dioxide film 2 by making use of the LPCVD method. This polycrystalline silicon film 3 is intended to be used as a first gate electrode or a so-called floating gate in general.

Then, as shown in FIG. 1D, a silicon dioxide film 4, a silicon nitride film 5 and a silicon dioxide film 6, each having a thickness of 6 nm, are successively formed on the floating gate 3 by making use of the LPCVD method. The insulator film having this three-layered structure is intended to be used as a second gate insulator film or a so-called inter-poly insulator film or a so-called ONO film in general.

Thereafter, as shown in FIG. 1E, a polycrystalline silicon film 8 containing phosphorus as an impurity is formed on the ONO film 7 by making use of the LPCVD method. This polycrystalline silicon film 8 is intended to be used as a second gate electrode or a so-called control gate in general.

Further, as shown in FIG. 1F, a photoresist 9 is coated on the control gate 8 and then worked into a desired pattern by making use of a photoengraving method. Subsequently, as shown in FIG. 1G, the control gate 8, the ONO film 7 and the floating gate 3 are successively etched perpendicularly by means of a dry etching method such as an RIE (Reactive Ion Etching) method with the photoresist 9 being employed as a mask. In this occasion, the silicon dioxide film 2 functions as an etching stopper when the floating gate 3 is etched.

Then, as shown in FIG. 1H, a photoresist 9 is removed. Thereafter, as shown in FIG. 2A, a silicon dioxide film 10 is formed by means of a thermal oxidation method for the purposes of suppressing a leak current at the gate terminal, improving the surface breakdown voltage of peripheral circuit MOS transistor of high breakdown voltage, i.e. the breakdown voltage of the gate insulator film, and recovering from a damage that might be introduced via the gate electrode into the gate oxide film at the occasion of the RIE etching. This oxidation process is generally called a post-oxidation process, and the silicon dioxide film 10 formed in this process is called a post-oxide film.

Subsequently, source/drain regions (not shown) are formed by way of ion implantation using an impurity, and, in subsequent to the deposition of an insulator film (not shown) and formation of openings, predetermined wirings (not shown) are formed thereon, thus forming the memory cell portion of the EEPROM.

In the followings, problems associated with this conventional manufacturing method of the memory cell will be explained.

First of all, oxygen, etc. functioning as an oxidant may be diffused from the oxide films 4 and 6 of the ONO film 7, thereby oxidizing the polycrystalline silicon film of the control gate 3 and the floating gate 8. Specifically, the gate terminal of the ONO film 7 is excessively oxidized, thus increasing the thickness of oxide film as indicated for instance by the reference numeral 11 in FIGS. 2A and 2B. This swollen oxide film portion 11 which is formed at the gate terminal is generally called a gate bird's beak.

This gate bird's beak invites an increase in effective film thickness of the inter poly-insulator film 7, and since it is difficult to control the manner of formation of the gate bird's beak, it will give rise to non-uniformity in film thickness of the inter poly-insulator film 7 between the memory cells.

Moreover, as shown in FIG. 2A, as the gate length 12 becomes shorter due to an increased fineness of the memory cell, the ratio of the gate bird's beak length 11 to the gate length 12 becomes larger. Therefore, the influence of the gate bird's beak will become more prominent as the fineness of memory cell is further advanced, so that any attempt to make the inter-poly insulator film 7 thinner will be substantially hindered.

Further, since the silicon dioxide film formed by means of the CVD method is poor in the effect of inhibiting the diffusion of oxidant as compared with the silicon dioxide film formed by means of thermal oxidation method, the gate bird's beak will creep more prominently and deeply in the inter-poly insulator film 7.

Usually, the writing and erasing of data to a memory cell are effected at first by distributing the voltage impressed onto the control gate 8 by the ratio between the capacity of the capacitor constituted by the substrate 1, the tunnel oxide film 2 and the floating gate 3 and the capacity of the capacitor constituted by the floating gate 3, the inter-poly insulator film 7 and the control gate 8, and then by impressing thus distributed voltage onto the inter-poly insulator film 7. Therefore, if the film thickness of the inter-poly insulator film 7 is increased due to the aforementioned post-oxidation, or the film thickness of the inter-poly insulator film 7 is non-uniform, the writing and erasing characteristics of the memory cell will be deteriorated or fluctuated.

Furthermore, if the gate terminal of the inter-poly insulator film 7 is oxidized, the growth of crystal grain of the polycrystalline silicon constituting the floating gate 3 and the control gate 8 is promoted. As a result, the shape of gate electrodes of the floating gate 3 and the control gate 8 would be deformed, thus giving rise to a local concentration of electric field in the inter-poly insulator film 7. As a result, the reliability of the insulator film would be deteriorated, or under some circumstance, it may give rise to a defective insulator film, thus deteriorating the yield of memory cell.

FIG. 3 is a graph illustrating the distribution of breakdown voltage of the ONO film before and after the post-oxidation. It will be seen from FIG. 3 that when the post-oxidation is performed, the distribution of breakdown voltage of the ONO film is enlarged and at the same time the breakdown voltage is lowered.

In the foregoing, the problem of gate bird's beak in the inter-poly insulator film 7 has been mainly discussed. However, a bird's beak similar to that mentioned above may also be generated in the tunnel oxide film 2 due to the post-oxidation, thereby causing an increase in film thickness or the non-uniformity of film thickness of the tunnel oxide film 2, thus deteriorating the characteristics of the memory cell.

Furthermore, it is impossible with the aforementioned conventional manufacturing method to perform the en bloc working of the gates of the memory cell portion and peripheral circuit transistor portion of the flash EEPROM.

FIGS. 4A to 4J and FIGS. 5A to 5J illustrate the manufacturing process for simultaneously working the gates of the memory cell portion and the peripheral circuit transistor portion, and problems involved in this manufacturing process. Specifically, FIGS. 4A to 4J show the cross-sections of the memory cell portion in the manufacture thereof; while FIGS. 5A to 5J show the cross-sections of the peripheral circuit portion in the manufacture thereof.

First of all, a field oxide film (not shown) for isolation is formed on a p-type silicon substrate 1 by making use of a selective oxidation method. Then, as shown in FIGS. 4A and 5A, a silicon dioxide film 13 having a thickness of 20 nm is formed on the silicon dioxide substrate 1 by making use of a thermal oxidation method. Subsequently, a photoresist 14 is coated on the silicon dioxide film 13 and then a portion of the photoresist 14 that has been coated on the memory cell portion is removed by making use of a photoengraving method.

Thereafter, as shown in FIGS. 4B and 5B, a portion of silicon dioxide film 13 that has been coated on the memory cell portion is selectively removed by means of a wet etching method with the photoresist 14 being used as a mask, and then the photoresist 14 is also removed.

Then, as shown in FIGS. 4C and 5C, a silicon dioxide film 2 having a thickness of 10 nm is formed by means of a thermal oxidation method. In this step, the film thickness of the silicon film 13 which has been formed in advance at the peripheral circuit portion is increased. The silicon dioxide film 2 is intended to be employed as a tunnel oxide film of the memory cell portion, while the silicon dioxide film 13 is intended to be employed as a gate oxide film of the peripheral circuit transistor.

Then, as shown in FIGS. 4D and 5D, a polycrystalline silicon film 3 having a thickness of 200 nm and containing phosphorus as an impurity is formed on the silicon dioxide film 2 by making use of the LPCVD method. This polycrystalline silicon film 3 is intended to be used as a floating gate in general. Then, an ONO film 7 comprising a silicon dioxide film 4, a silicon nitride film 5 and a silicon dioxide film 6 is formed on the floating gate 3 by making use of the LPCVD method. Thereafter, a photoresist 15 is formed on the ONO film 7 and a portion of which has been formed on the peripheral circuit transistor is removed by making use of a photo-engraving method.

Thereafter, as shown in FIGS. 4E and 5E, a portion of ONO film 7 that has been formed on the peripheral circuit transistor portion is selectively removed by means of the RIE method with the photoresist 15 being used as a mask, and then the photoresist 15 is also removed.

Then, a polycrystalline silicon film 8 having a thickness of 300 nm and containing phosphorus as an impurity is formed all over the surface by means of the LPCVD method. At the memory portion, this polycrystalline silicon film 8 is formed on the ONO film 7 and functions as a control gate. At the peripheral transistor portion, the polycrystalline silicon film 8 is formed on the polycrystalline silicon film 3, and these polycrystalline silicon films 3 and 8 are used as the gate electrode of a MOS transistor.

Further, as shown in FIGS. 4F and 5F, a photoresist 16 is coated on the polycrystalline film 8, and then the portions of the photoresist 16 that have been formed on the memory cell portion and the peripheral circuit transistor portion are worked respectively into a desired pattern by means of a photo-engraving method.

Then, the polycrystalline film 8 is subjected to etching by means of the RIE method with the photoresist 16 being used as a mask. In this RIE, an etching gas having an selective etching property, i.e. an etching gas which is capable of etching silicon but incapable of etching silicon dioxide film and silicon nitride film is employed. In this etching process, the ONO film 7 acts as an etching stopper in the memory cell portion as shown in FIG. 4G. Whereas, in the peripheral circuit transistor portion, since the ONO film is not existed as shown in FIG. 5G, the polycrystalline silicon film 3 is also etched so that the silicon dioxide film 13 acts as an etching stopper.

Furthermore, as shown in FIG. 4H, a portion of the ONO film 7 which is formed in the memory cell portion is etched by means of the RIE method employing an etching gas which is capable of etching silicon dioxide film and silicon nitride film but incapable of etching silicon.

Since the oxide film 13 is exposed in the peripheral circuit transistor portion in this etching step, the oxide film 13 is etched as shown in FIG. 5H, thus exposing the substrate 1. FIG. 5H shows a cross-section of the peripheral circuit transistor portion at this step.

Subsequently, the polycrystalline silicon film 3 is selectively and perpendicularly etched by means of the RIE method employing an etching gas which is capable of etching silicon but incapable of etching silicon dioxide film. In this etching process, the silicon dioxide film 2 acts as an etching stopper in the memory cell portion as shown in FIG. 4I.

Since the silicon substrate 1 is exposed in the peripheral circuit transistor portion in this etching step as shown in FIG. 5I, the silicon substrate 1 is etched.

Subsequently, as shown in FIGS. 4J and 5J, a photoresist 16 is removed.

If the gate electrodes of the memory cell portion and the peripheral circuit transistor portion are formed en bloc, a portion of the silicon substrate located beside the gate electrode in the peripheral circuit transistor portion is etched so that it is impossible to actuate the transistor of the peripheral circuit normally. Because of this reason, it is imperative for the conventional technique to perform the working of the gate electrode of the memory cell portions in separate from the working of gate electrode of the peripheral circuit transistor portions.

Moreover, since the silicon nitride film can be hardly oxidized, it is conceivable to form the inter-poly insulator film only with the silicon nitride film so as to prevent the degradation of the inter-poly insulator film. However, since the silicon nitride film formed by means of the LPCVD method is prone to generate a lot of leak current, problems may be raised if the silicon nitride film is employed as it is as an inter-poly insulator film.

BRIEF SUMMARY OF THE INVENTION

Accordingly, an object of the present invention is to provide a semiconductor device having excellent properties and being capable of preventing the formation of gate bird's beak, thinning the gate insulator film and enhancing the withstanding voltage.

Another object of this invention is to provide a method of manufacturing a semiconductor device, which makes it possible to manufacture the semiconductor device having excellent properties and being capable of preventing the formation of gate bird's beak, thinning the gate insulator film and enhancing the withstanding voltage in a small number of manufacturing steps and at low cost.

Namely, according to the present invention, there is provided a semiconductor device comprising;

a semiconductor substrate;

a first gate insulator film formed on the semiconductor substrate;

a first gate electrode formed on the first gate insulator film;

a second insulator film formed on the first gate electrode and formed of a three-ply structure comprising a silicon dioxide film, a silicon nitride film and a silicon dioxide film;

a second gate electrode formed on the second insulator film; and a silicon film doped with nitrogen and an impurity, and interposed between the first gate electrode and the second gate insulator film and/or between the second gate insulator film and the second gate electrode.

According to the present invention, there is further provided a semiconductor device comprising;

a semiconductor substrate;

a first gate insulator film formed on the semiconductor substrate;

a first gate electrode formed on the first gate insulator film;

a second insulator film formed on the first gate electrode and formed of a silicon nitride film;

a second gate electrode formed on the second insulator film; and a silicon film doped with nitrogen and an impurity, and interposed between the first gate electrode and the second gate insulator film.

Further, according to the present invention, there is also provided a semiconductor device comprising;

a semiconductor substrate;

a gate insulator film formed on the semiconductor substrate;

a silicon film formed on the gate insulator film and doped with nitrogen and an impurity; and a gate electrode formed on the silicon film doped with nitrogen and an impurity.

Furthermore, according to the present invention, there is provided a semiconductor device comprising;

a semiconductor substrate;

a first gate insulator film formed on the semiconductor substrate;

a first gate electrode formed on the first gate insulator film;

a second insulator film formed on the first gate electrode;

a second gate electrode formed on the second insulator film; and a silicon film doped with nitrogen and an impurity, and interposed between the first gate electrode and the second gate insulator film and/or between the second gate insulator film and the second gate electrode.

Additionally, according to the present invention, there is also provided a method of manufacturing a semiconductor device, which comprises the steps of:

forming a first gate insulator film on a semiconductor substrate;

forming a first gate electrode on the first gate insulator film;

forming a first silicon film doped with nitrogen and an impurity on the first gate electrode;

forming a second gate insulator film on the first silicon film doped with nitrogen and an impurity; and forming a second electrode on the second gate insulator film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6A to 6H respectively shows a cross-sectional view illustrating a process for manufacturing the memory cell portion of a flash EEPROM according to a first example of this invention;

FIGS. 7A and 7B respectively shows a cross-sectional view showing the structure of the memory cell portion obtained in the processes shown in FIGS. 6A to 6H;

FIG. 8 shows a graph illustrating the oxidation rate of a polycrystalline silicon film doped with nitrogen and of a dopant-free polycrystalline silicon film;

DETAILED DESCRIPTION OF THE INVENTION

Figure 1A:
FIGS. 1A to 1H respectively shows a cross-sectional view illustrating a process for manufacturing the memory cell portion of a flash EEPROM representing a non-volatile memory according to the prior art.
Figure 1B:
Figure 1C:
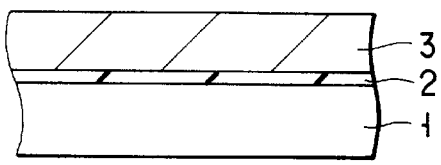
Figure 1D:
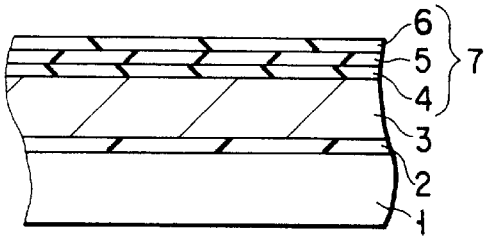
Figure 1E:
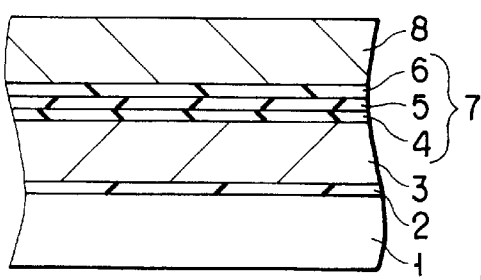
Figure 1F:
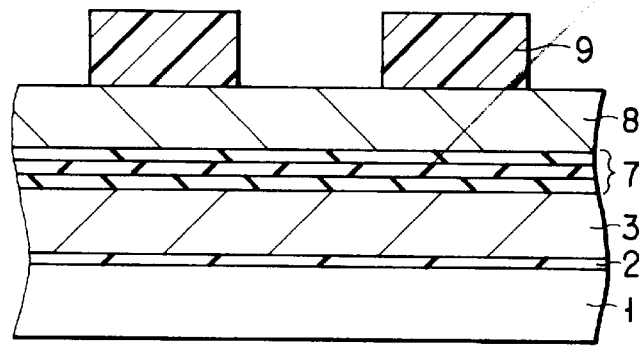
Figure 1G:
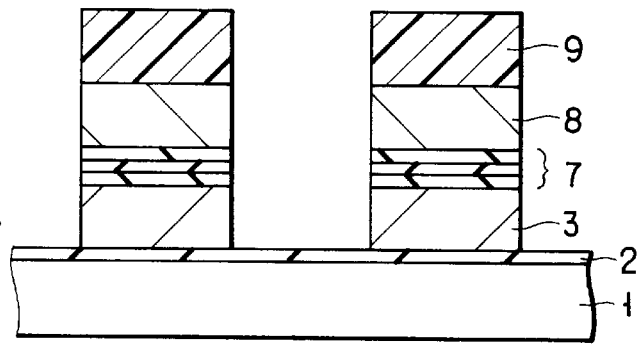
Figure 1H:
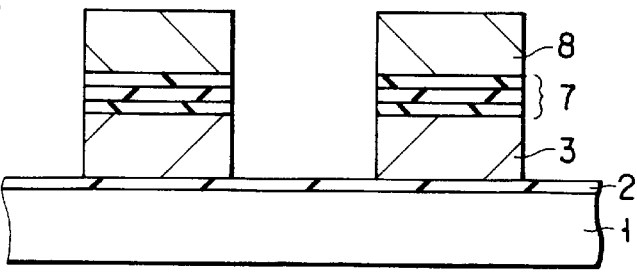
Figure 2A:
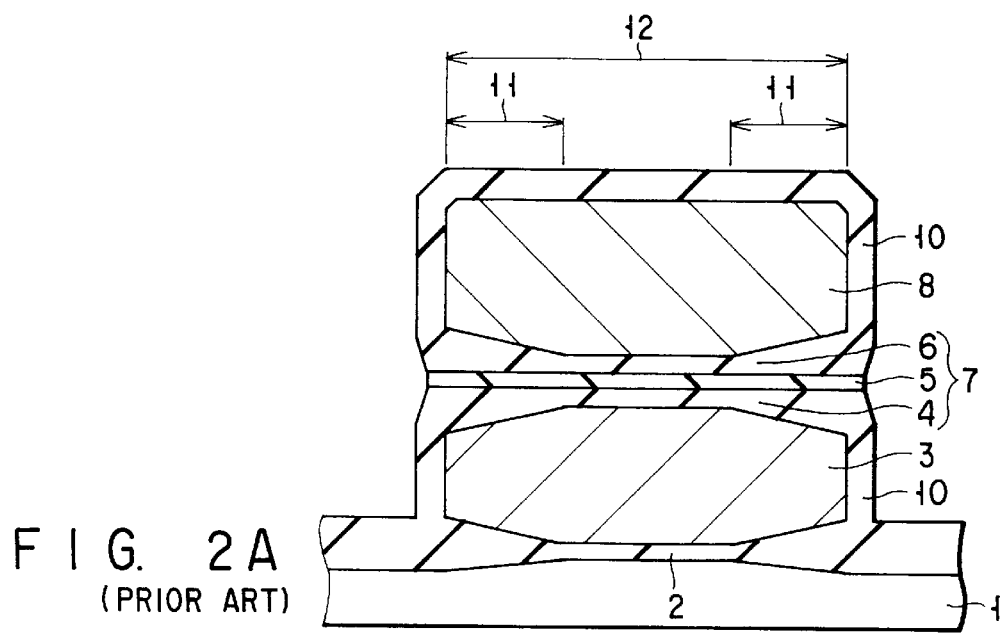
FIGS. 2A and 2B respectively shows a cross-sectional view showing the structure of the memory cell portion obtained in the processes shown in FIGS. 1A to 1H.
Figure 2B:
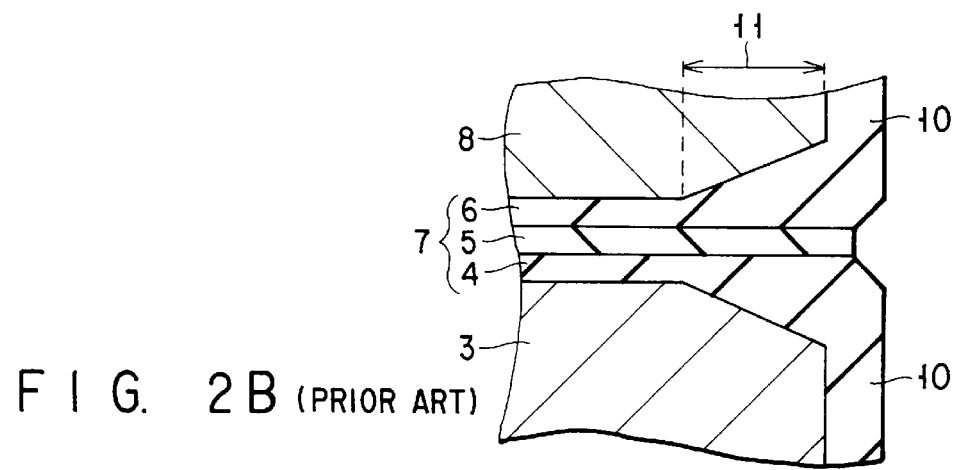
Figure 3:
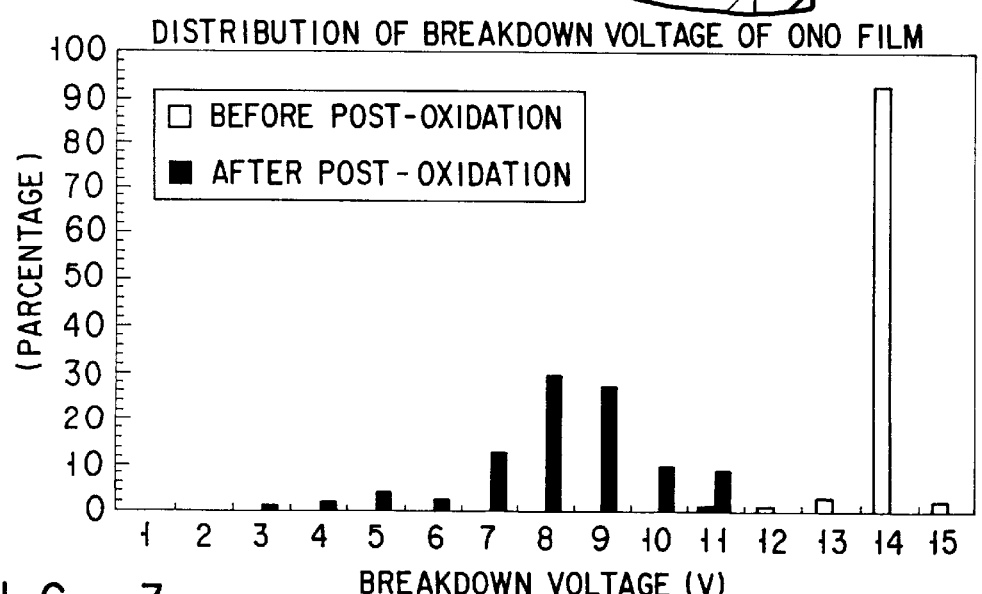
FIG. 3 shows a graph illustrating the distribution of the breakdown voltage of an ONO film before and after a post-oxidation process.
Figure 4A:
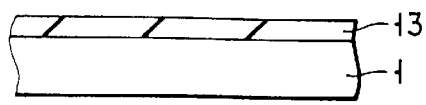
FIGS. 4A to 4J respectively shows a cross-sectional view illustrating the manufacturing process of the memory cell portion of a flash EEPROM according to the prior art.
Figure 4B:
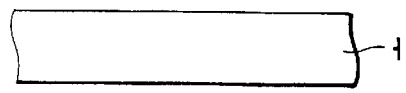
Figure 4C:
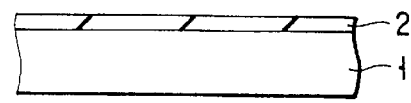
Figure 4D:
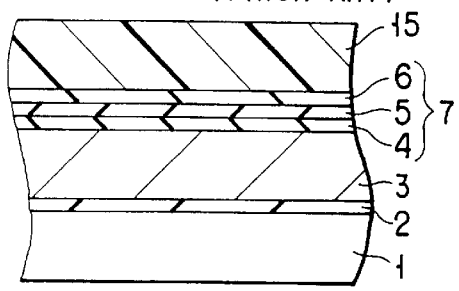
Figure 4E:
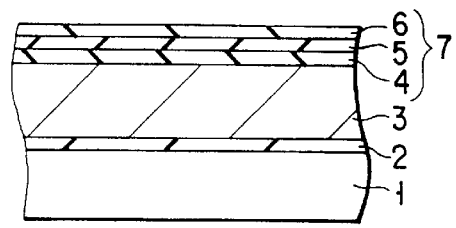
Figure 4F:
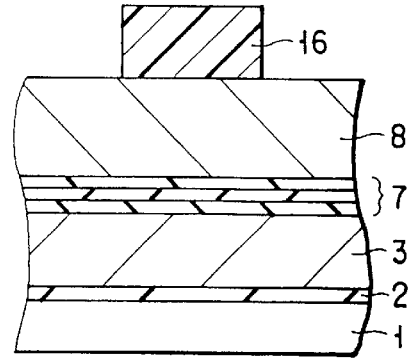
Figure 5A:
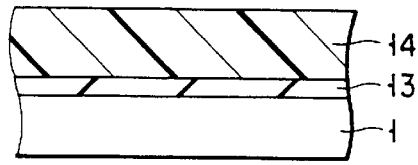
FIGS. 5A to 5J respectively shows a cross-sectional view illustrating the manufacturing process of the peripheral circuit transistor portion of a flash EEPROM according to the prior art.
Figure 5B:
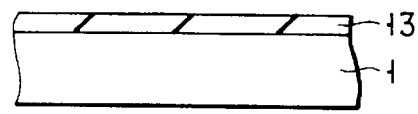
Figure 5C:
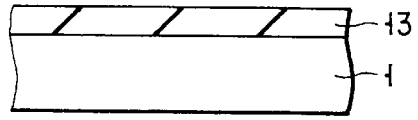
Figure 5D:
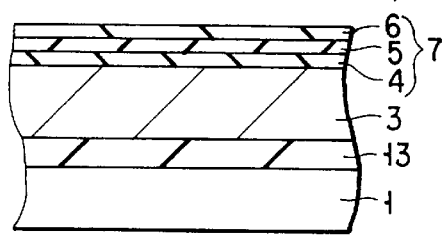
Figure 5E:
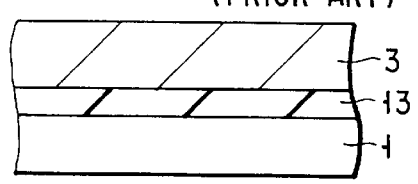
Figure 5F:
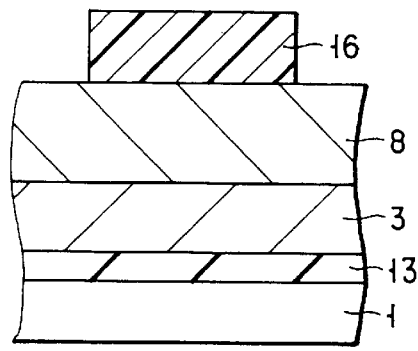
Figure 4G:
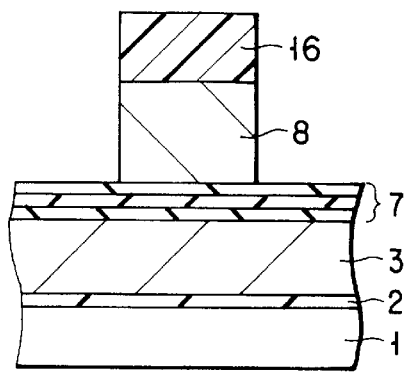
Figure 5G:
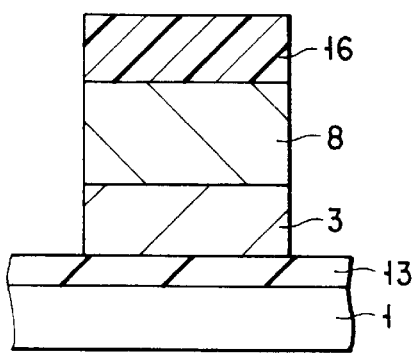
Figure 4H:
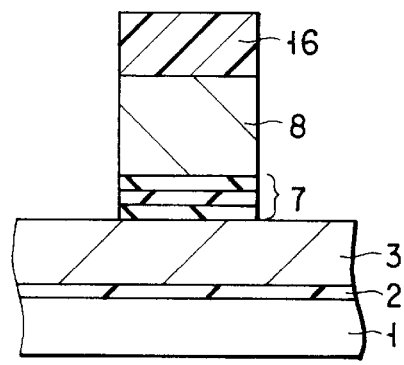
Figure 5H:
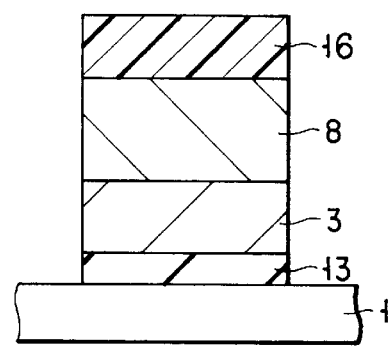
Figure 4I:
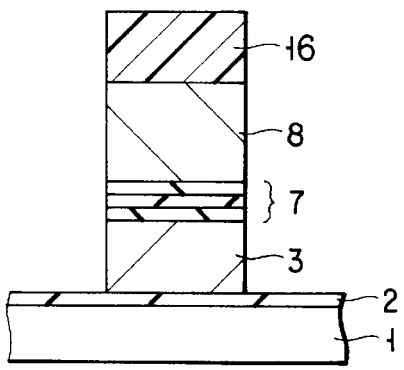
Figure 5I:
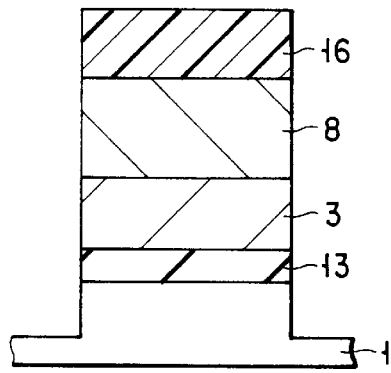
Figure 4J:
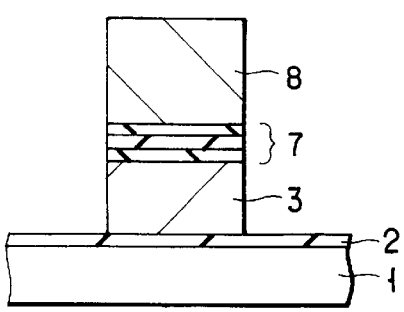
Figure 5J:
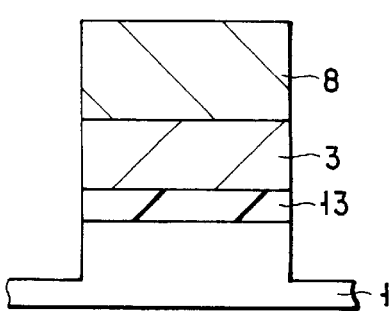

This invention will be further explained in detail as follows.

A semiconductor device according to this invention is featured in that a silicon film doped with nitrogen and an impurity is disposed in contact with an insulator film interposed between the floating gate and the control gate (or a so-called inter-poly insulator film) in the memory cell portion of the EEPROM, or in contact with a gate insulator film of the MOSFET. Since this silicon film contains a predetermined amount of nitrogen, it can be hardly oxidized so that the growth of oxide film or the formation of so-called gate bird's beak at the terminal of the inter-poly insulator film or the gate insulator film can be inhibited. Furthermore, since this silicon film contains an impurity so as to provide it with a predetermined conductivity, the conductivity of the gate electrode would not be hindered.

This silicon film should preferably contain nitrogen at a concentration of $5\times10^{18}$ to $5\times10^{21}$ atom/cm$^3$, more preferably $1\times10^{21}$ to $5\times10^{21}$ atom/cm$^3$. If the concentration of nitrogen in the silicon film is less than $5\times10^{18}$ atom/cm$^3$, it would be difficult to expect a sufficient effect to inhibit the growth of the oxide film at the terminal of the inter-poly insulator film or of the gate insulator film. On the other hand, if the concentration of nitrogen in the silicon film exceeds over $5\times10^{21}$ atom/cm$^3$, the conductivity of the silicon film will be damaged.

The concentration of the impurity in this silicon film should preferably be at least $1\times10^{18}$ atom/cm$^3$, more preferably $1\times10^{20}$ to $1\times10^{21}$ atom/cm$^3$. If the concentration of the impurity in the silicon film is less than $1\times10^{18}$ atom/cm$^3$, the delay time due to increase in the resistivity generates, and the circuit performance may deteriorate.

As for the impurity to be doped in this silicon film, phosphorus and arsenic can be employed.

As for the kind of this silicon film useful in this invention, a polycrystalline silicon film can be generally employed. However, it is also possible to employ an amorphous silicon film.

With regard to the method of obtaining this silicon film containing nitrogen, a method wherein a silicon film is subjected to a heat treatment in an ammonia atmosphere, or a method wherein a silicon film is subjected to an ion implantation with nitrogen may be employed.

The film thickness of the silicon film should preferably be at least 3 nm, more preferably 3 to 50 nm. If the film thickness of the silicon film is less than 3 nm, the oxidation resistance of the silicon film becomes low, and the post oxidation penetrates the silicon film, and therefore, desire effect may not be obtained. On the other hand, if the film thickness of the silicon film exceeds over 50 nm, the resistivity of the silicon film becomes high, and the performance as a gate electrode may deteriorate.

If the silicon film is to be formed in contact with the inter-poly insulator film of EEPROM, the silicon film is interposed between the floating gate and the inter-poly insulator film and/or between the inter-poly insulator film and the control gate. In particular, the silicon film should be interposed between the floating gate and the inter-poly insulator film. On the other hand, if the silicon film is to be formed in contact with the gate insulator film of MOSFET, the silicon film is interposed between the gate insulator film and the gate electrode.

This invention will be further explained in detail with reference to various embodiments as follows.

FIGS. 6A to 6H respectively shows a cross-sectional view illustrating a process for manufacturing the memory cell portion of a flash EEPROM according to a first example of this invention. This embodiment is featured in that a polycrystalline silicon film doped with nitrogen is formed over and below the ONO film of the memory cell portion of the flash EEPROM.

First of all, as shown in FIG. 6A, a field oxide film (not shown) is formed on a p-type silicon substrate 1 for the purpose of element isolation by making use of a selective oxidation method. Then, as shown in FIG. 6B, a silicon dioxide film 2 having a thickness of 10 nm which is to be used as a tunnel oxide film is formed on the silicon dioxide substrate 1 by making use of a thermal oxidation method.

Then, as shown in FIG. 6C, a polycrystalline silicon film 3 having a thickness of 200 nm and containing phosphorus as an impurity is formed on the silicon dioxide film 2 by making use of the LPCVD method wherein a silane type gas such as monosilane (SiH$_4$), disilane (Si$_2$H$_6$), etc. and phosphine (PH$_3$) are employed as a raw material gas. Then, without interrupting the growth of the film, NH$_3$ gas is added to the aforementioned raw material gas by making use of the same LPCVD apparatus, whereby forming a polycrystalline silicon film 20 having a thickness of 30 nm. With the formation of the polycrystalline silicon films 3 and 20, a floating gate is constructed.

This polycrystalline silicon film 20 doped with nitrogen and phosphorus is featured in that it exhibits conductivity and can be hardly oxidized. For the purpose of these features, polycrystalline silicon film 20 should be doped with nitrogen at a concentration of about $1\times10^{21}$ to $5\times10^{21}$ atom/cm$^3$ for instance and with phosphorus at a concentration of about $1\times10^{20}$ to $1\times10^{21}$ atom/cm$^3$ for instance.

Then, as shown in FIG. 6D, a silicon dioxide film 4, a silicon nitride film 5 and a silicon dioxide film 6, each having a thickness of 6 nm, are successively formed on polycrystalline silicon film 20 by making use of the LPCVD method. With these films, the ONO film is constructed.

Thereafter, as shown in FIG. 6E, a polycrystalline silicon film 21 having a thickness of 30 nm for example and containing phosphorus and nitrogen as impurities is formed on the ONO film 7 by making use of the LPCVD method. Then, without interrupting the growth of film, a polycrystalline silicon film 8 having a thickness of 200 nm for example and containing phosphorus as an impurity is further deposited. With these polycrystalline silicon films 8 and 21, a control gate is constructed.

The polycrystalline silicon film 21 doped with nitrogen and phosphorus is required to be conductive and hardly oxidizable. For this reason, the concentration of each nitrogen and phosphorus should be set to the same range as in the case of the polycrystalline silicon film 20.

Further, as shown in FIG. 6F, a photoresist 9 is coated on the control gate 8 and then worked into a desired pattern by making use of a photoengraving method. Subsequently, as shown in FIG. 6G, the control gate 8, the ONO film 7 and the polycrystalline silicon films 20 and 3 are successively etched perpendicularly by means of an RIE (Reactive Ion Etching) method with the photoresist 9 being employed as a mask, thereby forming the control gate and the floating gate. At the occasion of etching the polycrystalline silicon film 3, the silicon dioxide film 2 acts as an etching stopper. Thereafter, the photoresist 9 is removed as shown in FIG. 6H.

Then, a silicon dioxide film 10 representing a post-oxide film is formed by means of a thermal oxidation method thereby to obtain the structure of the memory cell portion as shown in FIG. 7A. By the way, FIG. 7B represents the shape of the gate terminal of the inter-poly insulator film.

Subsequently, source/drain regions (not shown) are formed by way of ion implantation using an impurity, and, in subsequent to the deposition of an insulator film (not shown) and formation of openings, predetermined wirings (not shown) are formed thereon, thus forming the memory cell portion of the EEPROM.

In this embodiment, the oxidation rate of these polycrystalline silicon films 20 and 21 each containing nitrogen is relatively slow. FIG. 8 shows a graph illustrating the oxidation rate of a polycrystalline silicon film doped with nitrogen and of a dopant-free polycrystalline silicon film. It would be clear from FIG. 8 that the polycrystalline silicon film containing nitrogen is slower in oxidation rate as compared with the polycrystalline silicon film not containing nitrogen. Accordingly, the growth of oxide film during the post-oxidation at these polycrystalline silicon films 20 and 21 disposed on the upper and lower sides of the ONO film 7 would be suppressed, thus making it possible to minimize the film thickness at the gate terminal of the inter-poly insulator film 7 as compared with that can be obtained according to the prior art. Moreover, since these polycrystalline silicon films 20 and 21 doped with nitrogen are conductive, there is no possibility of lowering the capacity between the floating gate and the control gate.

Additionally, it is possible to suppress the growth of crystal grains at the floating gate and the control gate, and hence to prevent the ONO film from being degraded due to a deformation of the gate electrode.

In this embodiment, these polycrystalline silicon films 20 and 21 doped with nitrogen are formed by means of the LPCVD method. However, this invention is not limited to such an embodiment, i.e. nitrogen may be introduced into the polycrystalline silicon by means of an ion-implantation or by heat-treating the polycrystalline silicon in an ammonia atmosphere.

Furthermore, according to this embodiment, although an ONO film has been employed as an inter-poly insulator film 7, this invention is not confined to that, i.e. it is possible to obtain almost the same effect even if the inter-poly insulator film 7 is constituted by only a silicon dioxide film, by only a silicon nitride film or by a laminated insulator film consisting of two or more layers of silicon dioxide film and silicon nitride film.

According to this embodiment, the polycrystalline silicon films 20 and 21 each doped with nitrogen are disposed respectively at an interface where the inter-poly insulator film 7 is contacted with the floating gate or with the control gate. However, this invention is not confined to that, i.e. the polycrystalline silicon film doped with nitrogen may be disposed on at least either one of these interfaces, thereby obtaining almost the same effect as in this embodiment as far as the interface which is provided with such a polycrystalline silicon film is concerned.

According to this embodiment, although nitrogen is added to a polycrystalline silicon film, it is also possible to obtain almost the same effect by adding nitrogen to an amorphous silicon film. In this case, an amorphous silicon film can be formed instead of a polycrystalline silicon film by lowering the deposition temperature in the LPCVD method.

FIGS. 9A to 9H respectively shows a cross-sectional view illustrating a process for manufacturing the memory cell portion of a flash EEPROM according to a second example of this invention. This embodiment is featured in that the inter-poly insulator film is constituted by only a silicon nitride film.

Figure 9A:
FIGS. 9A to 9H respectively shows a cross-sectional view illustrating a process for manufacturing the memory cell portion of a flash EEPROM according to a second example of this invention.
Figure 9B:
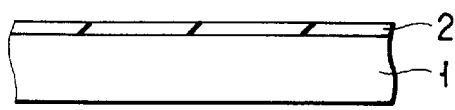

First of all, as shown in FIG. 9A, a field oxide film (not shown) is formed on a p-type silicon substrate 1 for the purpose of element isolation by making use of a selective oxidation method. Then, as shown in FIG. 9B, a silicon dioxide film 2 having a thickness of 10 nm which is to be used as a tunnel oxide film is formed on the silicon dioxide substrate 1 by making use of a thermal oxidation method.

Figure 9F:
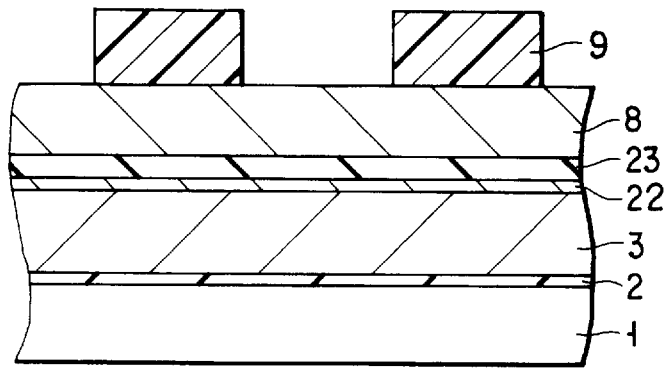
Figure 9C:
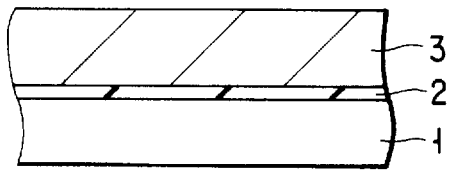
Figure 9D:
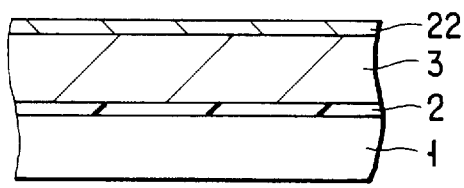

Then, as shown in FIG. 9C, a polycrystalline silicon film 3 having a thickness of 200 nm and containing phosphorus as an impurity is formed on the silicon dioxide film 2 by making use of the LPCVD method. This polycrystalline silicon film 3 is intended to be used as a floating gate. Then, as shown in FIG. 9D, the polycrystalline silicon film 3 is subjected to a heat treatment in an NH3 atmosphere by making use of an LPCVD apparatus, thereby nitriding the natural oxide film on the polycrystalline silicon film 3 as well as the surface of the polycrystalline silicon film 3 to form a nitride film 22 thereon.

This nitride film 22 contains nitrogen, phosphorus and silicon, and is hence oxidation-resistant and conductive. In view of these features, the nitride film 22 should be doped with nitrogen at a concentration of about $1 \times 10^{21}$ to $5 \times 10^{21}$ atom/cm$^3$ for instance and with phosphorus at a concentration of about $1 \times 10^{20}$ to $1 \times 10^{21}$ atom/cm$^3$ for instance.

Figure 9G:
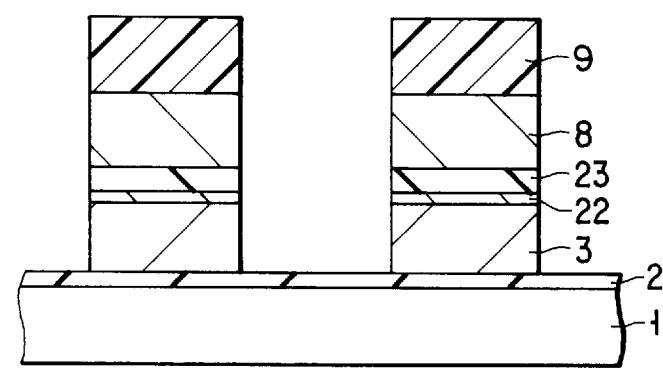
Figure 9E:
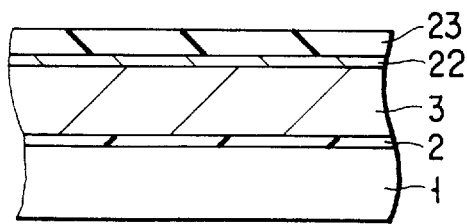

Thereafter, as shown in FIG. 9E, a silicon nitride film 23 is formed successively on the nitride film 22 by making use of the LPCVD method employing NH3 and dichlorosilane (SiH$_2$Cl$_2$). This silicon nitride film 23 is intended to be used as an inter-poly insulator film.

Then, as shown in FIG. 9F, a polycrystalline silicon film 8 having a thickness of 200 nm for example and containing phosphorus as an impurity is further deposited on the silicon nitride film 23 by means of the LPCVD method. This polycrystalline silicon film 8 is intended to be used as a control gate. Thereafter, a photoresist 9 is coated on the polycrystalline silicon film 8 and then worked into a desired pattern by making use of a photoengraving method.

Figure 9H:
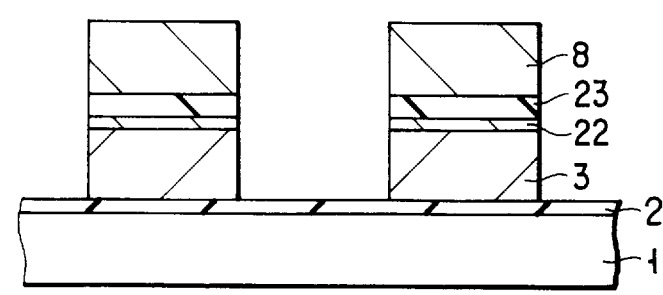

Subsequently, as shown in FIG. 9G, the control gate 8, the silicon nitride films 23 and 22, and the floating gate 3 are successively etched perpendicularly by means of an RIE method with the photoresist 9 being employed as a mask. At the occasion of etching the polycrystalline silicon film 3, the silicon dioxide film 2 acts as an etching stopper. Thereafter, the photoresist 9 is removed as shown in FIG. 9H.

Figure 10A:
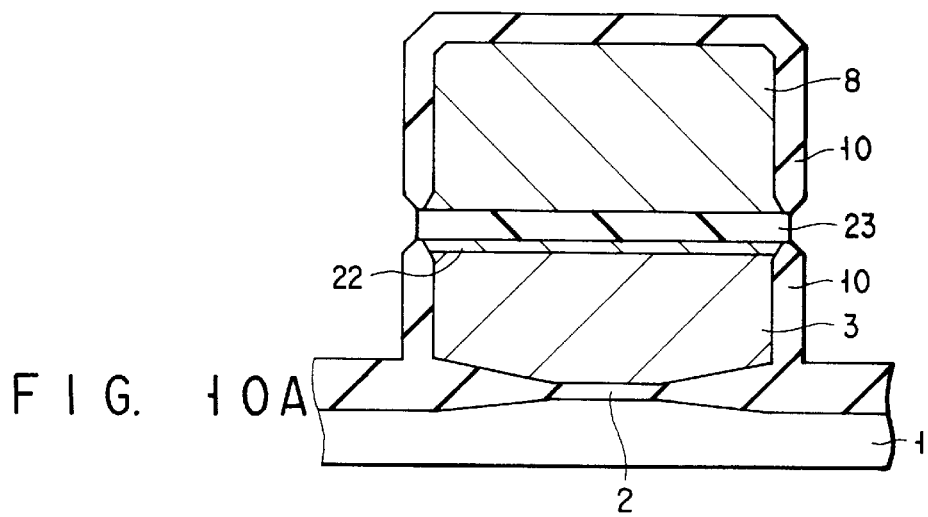
FIGS. 10A and 10B respectively shows a cross-sectional View showing the structure of the memory cell portion obtained in the processes shown in FIGS. 9A to 9H.
Figure 10B:
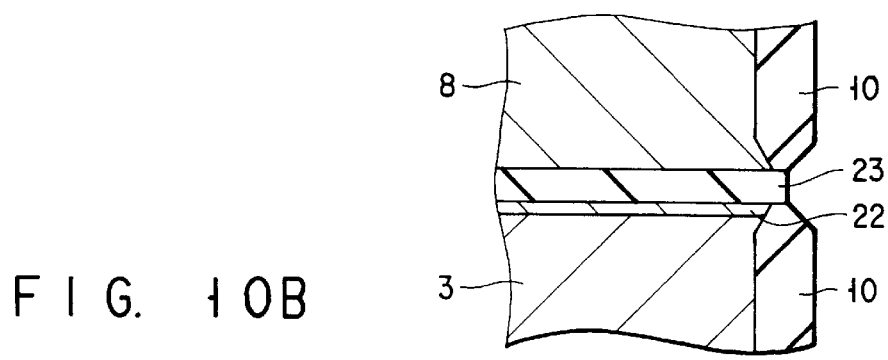

Then, a silicon dioxide film 10 representing a post-oxide film is formed by means of a thermal oxidation method thereby to obtain the structure of the memory cell portion as shown in FIG. 10A. By the way, FIG. 10B represents the shape of the gate terminal of the inter-poly insulator film.

Subsequently, source/drain regions (not shown) are formed by way of ion implantation using an impurity, and, in subsequent to the deposition of an insulator film (not shown) and formation of openings, predetermined wirings (not shown) are formed thereon, thus forming the memory cell portion of the EEPROM.

As explained above, according to this embodiment, the inter-poly insulator film is constituted by only a silicon nitride film. Since this silicon nitride film is capable of inhibiting the diffusion of oxygen and is resistive to oxidation, it is possible to inhibit the generation of gate bird's beak at the gate terminal in the post-oxidation process.

Figure 11:
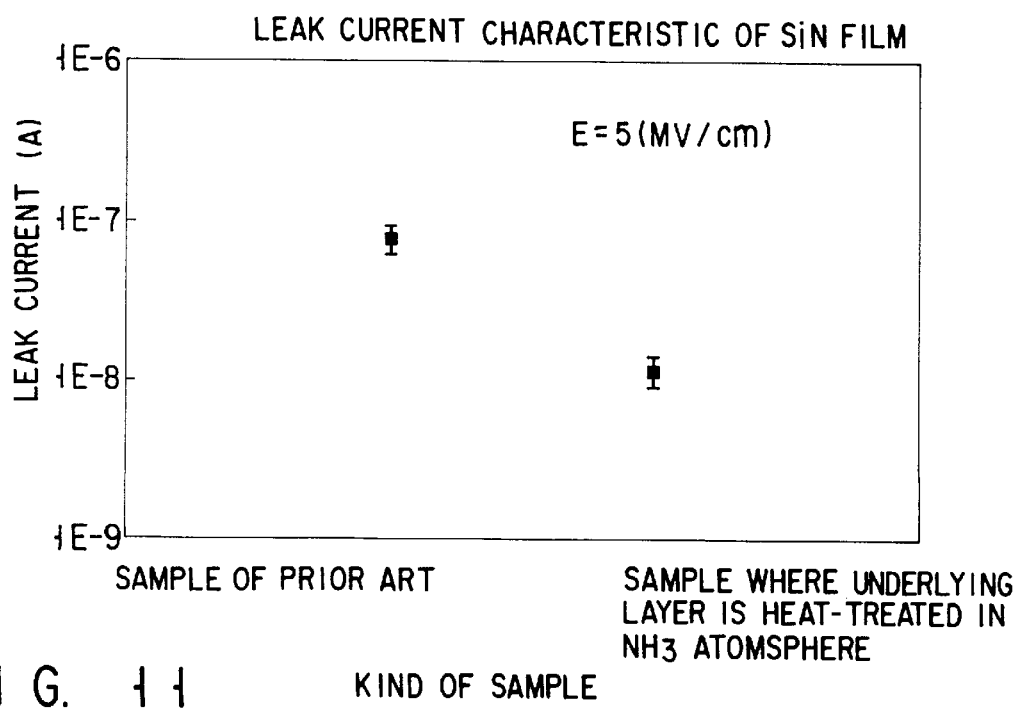
FIG. 11 is a graph illustrating a leak current in the conventional SiN film which has been formed by means of the LPCVD method, and a leak current in an SiN film which has been formed by means of the LPCVD method after the underlying film has been thermally nitrified in advance in an ammonia atmosphere.

Furthermore, since the underlying layer is thermally nitrified in an ammonia atmosphere to form a nitride film and a silicon nitride film is formed by means of the LPCVD method on the resultant nitride film, it is possible to sufficiently suppress the generation of leak current. FIG. 11 is a graph illustrating a leak current in the conventional SiN film which has been formed by means of the LPCVD method, and a leak current in an SiN film which has been formed by means of the LPCVD method after the underlying film has been thermally nitrified in advance in an ammonia atmosphere. These leak currents are measured at an electric field of 5 MV/cm, and the area of SiN film is the same in both cases. As seen from FIG. 11, the generation of leak current can be decreased by one figure by heat-treating the underlying layer.

Further, it is possible, by successively performing the step of nitriding treatment of the surface of the underlying film and the step of forming the silicon nitride film in the same LPCVD apparatus, to further enhance the reliability, as an insulator film, of the silicon nitride film. The step of thermal nitriding and the step of forming the silicon nitride film may not be performed in the same apparatus. For example, the underlying film may be thermally nitrified in the RTP apparatus, and then the silicon nitride film may be deposited thereon in the LPCVD apparatus, thus enabling the effects of suppressing the oxidation and of minimizing the leak current to be obtained likewise.

Since the ONO film is composed of a three-ply structure, it is difficult to decrease the effective film thickness and to control the film thickness thereof. By contrast, according to this embodiment, since the inter-poly insulator film is composed of single-layer structure consisting only of a silicon nitride film, the thinning of the film can be easily achieved and the controllability of film thickness can be assured, and the number of step can be decreased, thus saving the manufacturing cost.

Furthermore, since the inter-poly insulator film is composed only of a silicon nitride film, the gate electrodes of the memory cell and of the peripheral circuit transistor can be worked en bloc. FIGS. 12A to 12J and FIGS. 13A to 13J respectively illustrate the effect of a process for simultaneously working the gates of the memory cell portion and of the peripheral circuit transistor. Namely, FIGS. 12A to 12J respectively shows a cross-sectional view illustrating a process for manufacturing the memory cell portion, and FIGS. 13A to 13J respectively shows a cross-sectional view illustrating a process for manufacturing the peripheral circuit MOS transistor portion.

Figure 12A:
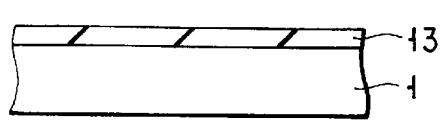
FIGS. 12A to 12J respectively shows a cross-sectional view illustrating a process for manufacturing the memory cell portion according to a second example of this invention.
Figure 13A:
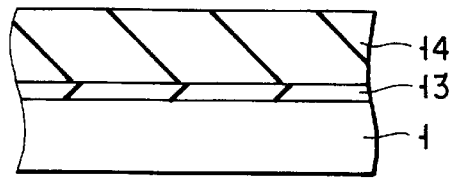
FIGS. 13A to 13J respectively shows a cross-sectional view illustrating a process for manufacturing the peripheral circuit MOS transistor portion according to a second example of this invention.

First of all, a field oxide film (not shown) for isolation is formed on a p-type silicon substrate 1 by making use of a selective oxidation method. Then, as shown in FIGS. 12A and 13A, a silicon dioxide film 13 having a thickness of 20 nm is formed on the silicon substrate 1 by making use of a thermal oxidation method. Subsequently, a photoresist 14 is coated on the silicon dioxide film 13 and then a portion of the photoresist 14 that has been coated on the memory cell portion is removed by making use of a photoengraving method.

Figure 12B:
Figure 13B:
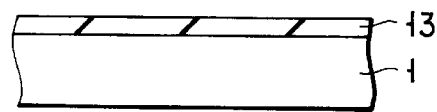

Thereafter, as shown in FIGS. 12B and 13B, a portion of silicon dioxide film 13 that has been coated on the memory cell portion is selectively removed by means of a wet etching method with the photoresist 14 being used as a mask, and then the photoresist 14 is also removed.

Figure 12C:
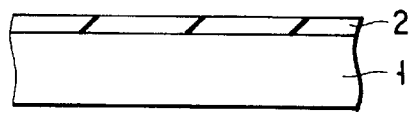
Figure 13C:
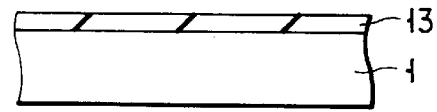

Then, as shown in FIGS. 12C and 13C, a silicon dioxide film 2 having a thickness of 10 nm is formed by means of a thermal oxidation method. In this oxidation step, the film thickness of the silicon film 13 of the peripheral circuit portion is increased. The silicon dioxide film 2 is intended to be employed as a tunnel oxide film of the memory cell portion, while the silicon dioxide film 13 is intended to be employed as a gate oxide film of the peripheral circuit transistor.

Figure 12D:
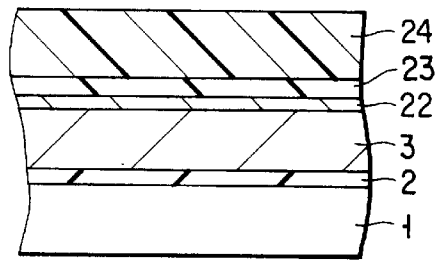
Figure 13D:
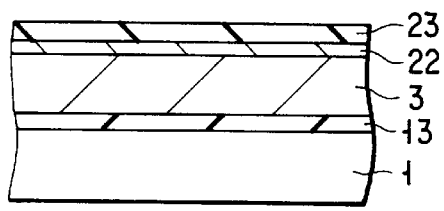

Then, as shown in FIGS. 12D and 13D, a polycrystalline silicon film 3 having a thickness of 200 nm and containing phosphorus as an impurity is formed on the silicon dioxide film 2 by making use of the LPCVD method. This polycrystalline silicon film 3 is intended to be used as a floating gate. Then, the polycrystalline silicon film 3 is subjected to a heat treatment in an $NH_3$ atmosphere, thereby nitriding the natural oxide film on the polycrystalline silicon film 3 as well as the surface of the polycrystalline silicon film 3 to form a nitride film 22 thereon. Then, a silicon nitride film 23 is formed on the nitride film 22 by means of the LPCVD method. This silicon nitride film 23 is intended to be used as an inter-poly insulator film. Subsequently, a photoresist 24 is coated on the silicon nitride film 23 and then a portion of photoresist 24 which is disposed on the peripheral circuit transistor portion is removed by means of a photoengraving method.

Figure 12E:
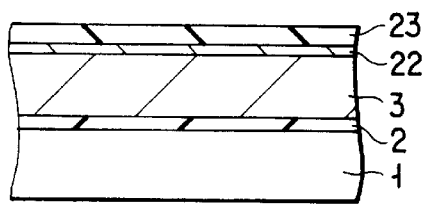
Figure 13E:
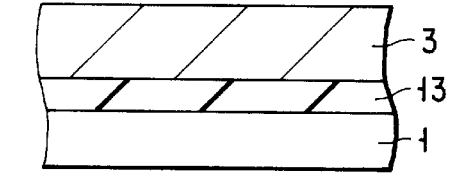

Thereafter, as shown in FIGS. 12E and 13E, the portions of nitride films 23 and 22 that has been formed on the peripheral circuit transistor portion are selectively removed by means of the RIE method with the photoresist 24 being used as a mask, and then the photoresist 24 is also removed.

Figure 12F:
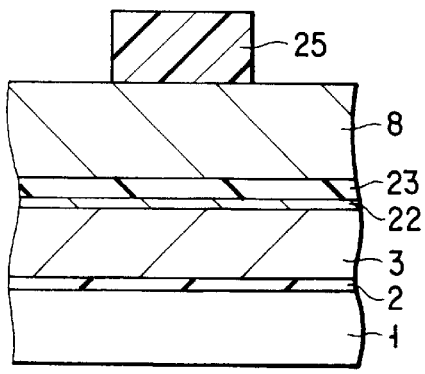
Figure 13F:
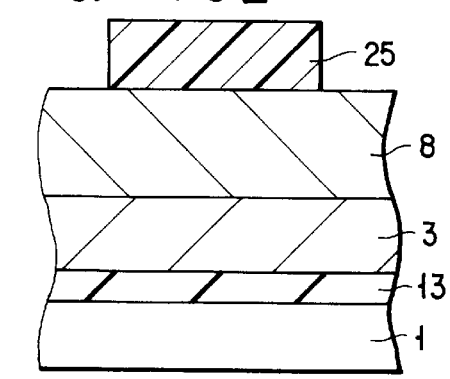

Then, as shown in FIGS. 12F and 13F, a polycrystalline silicon film 8 having a thickness of 300 nm and containing phosphorus as an impurity is formed all over the surface by means of the LPCVD method. At the memory portion, this polycrystalline silicon film 8 is formed on the silicon nitride film 23 to function as a control gate. At the peripheral transistor portion, the polycrystalline silicon film 8 and 3 are used as the gate electrode of a MOS transistor. Furthermore, a photoresist 25 is coated on the polycrystalline film 8, and then the portions of the photoresist 25 that have been formed on the memory cell portion and the peripheral circuit transistor portion are worked respectively into a desired pattern by means of a photo-engraving method.

Figure 12G:
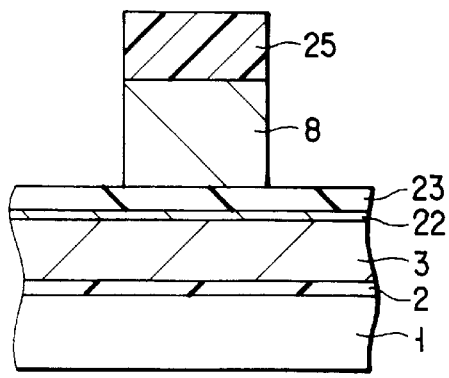
Figure 13G:
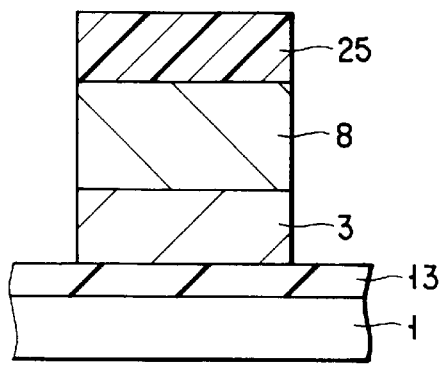

Then, as shown in FIGS. 12G and 13G, the polycrystalline film 8 is subjected to etching by means of the RIE method with the photoresist 25 being used as a mask. In this RIE method, an etching gas having an selective etching property, i.e. an etching gas which is capable of etching silicon but incapable of etching silicon dioxide film and silicon nitride film is employed. In this etching process, the silicon nitride film 23 acts as an etching stopper. Whereas, in the peripheral circuit transistor portion, the polycrystalline silicon film 8 and 3 are etched so that the silicon dioxide film 13 acts as an etching stopper.

Figure 12H:
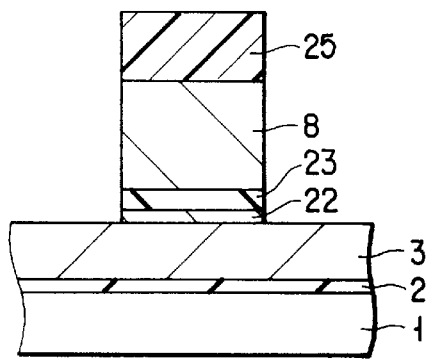
Figure 13H:
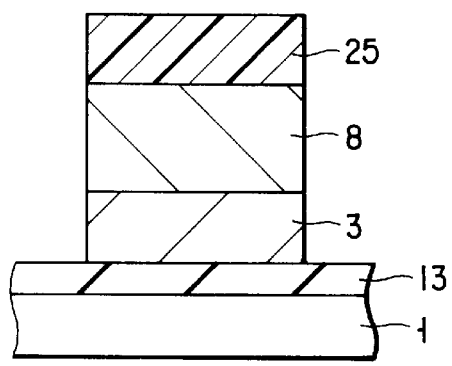

Furthermore, as shown in FIGS. 12H and 13H, the silicon nitride films 23 and 22 are etched perpendicularly with the photoresist being employed as a mask by means of the RIE method employing an etching gas having an etching selectivity, i.e. an etching gas which is capable of etching silicon nitride film but incapable of etching silicon dioxide film. Since the silicon dioxide film 13 is exposed in the peripheral circuit transistor portion in this etching step, the etching does not proceed in this peripheral circuit transistor portion.

Figure 12I:
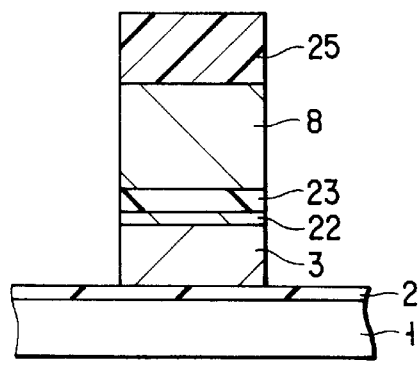
Figure 13I:
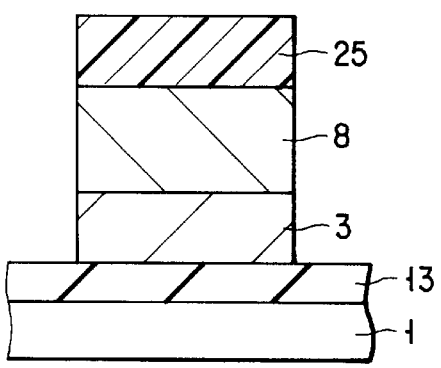
Figure 12J:
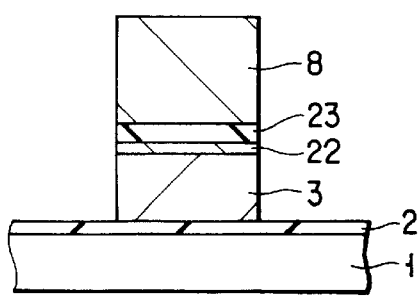
Figure 13J:
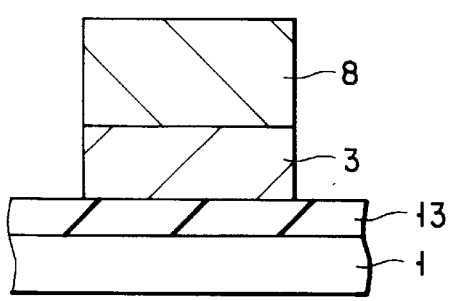

Subsequently, as shown in FIGS. 12I and 13I, the polycrystalline silicon film 3 is selectively and perpendicularly etched by means of the RIE method employing an etching gas which is capable of etching silicon but incapable of etching silicon dioxide film. Since the silicon dioxide film 13 is exposed at the peripheral circuit transistor portion in this etching process, the etching does not proceed. On the other hand, the silicon dioxide film 2 acts as an etching stopper in the memory cell portion. Thereafter, the photoresist 25 is removed as shown in FIGS. 12J and 13J.

Subsequently, source/drain regions (not shown) are formed by way of ion implantation using an impurity, and, in subsequent to the deposition of an insulator film (not shown) and formation of openings, predetermined wirings (not shown) are formed thereon, thus forming the memory cell portion and peripheral circuit MOS cell portion of the EEPROM.

As explained above, the material employed for the inter-poly insulator film of the memory cell differs from the material employed for the gate insulator film of the peripheral circuit MOS transistor, whereby making it possible to work en bloc the gate insulator films of the memory cell portion and the peripheral circuit MOS transistor portion, thus minimizing the number of the manufacturing step as compared with the conventional process.

FIGS. 14A to 14G respectively shows a cross-sectional view illustrating a process for manufacturing the MOSFET according to a third example of this invention. This embodiment is featured in that a polycrystalline silicon layer containing nitrogen is interposed between the gate insulator film and the gate electrode.

Figure 14A:
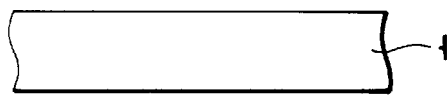
FIGS. 14A to 14G respectively shows a cross-sectional view illustrating a process for manufacturing a MOSFET according to a third example of this invention.
Figure 14B:
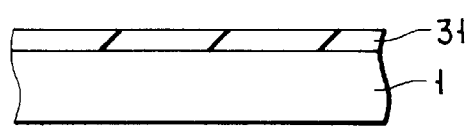

First of all, as shown in FIG. 14A, a field oxide film (not shown) is formed on a p-type silicon substrate 1 for the purpose of isolation by making use of a selective oxidation method. Then, as shown in FIG. 14B, a silicon dioxide film 31 having a thickness of 10 nm which is to be used as a tunnel oxide film is formed on the silicon dioxide substrate 1 by making use of a thermal oxidation method.

Figure 14C:
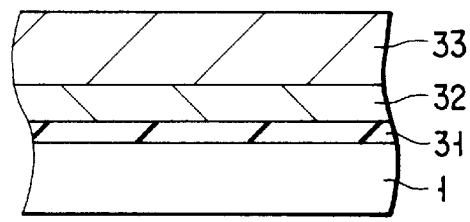

Then, as shown in FIG. 14C, a polycrystalline silicon film 32 having a thickness of 30 nm and containing phosphorus and nitrogen as impurities are formed on the silicon dioxide film 31 by making use of the LPCVD method. Then, without interrupting the growth of film, a polycrystalline silicon film 33 having a thickness of 200 nm and containing phosphorus as an impurity is successively formed by means of the LPCVD method. With these polycrystalline silicon films 32 and 33, a control gate is constructed.

This polycrystalline silicon film 33 doped with nitrogen and phosphorus is oxidation-resistant and conductive. In view of these features, the concentration of nitrogen is set to the range of about $1\times10^{21}$ to $5\times10^{21}$ atom/cm$^3$ for instance, and the concentration of phosphorus is set to the range of about $1\times10^{20}$ to $1\times10^{21}$ atom/cm$^3$ for instance.

Figure 14D:
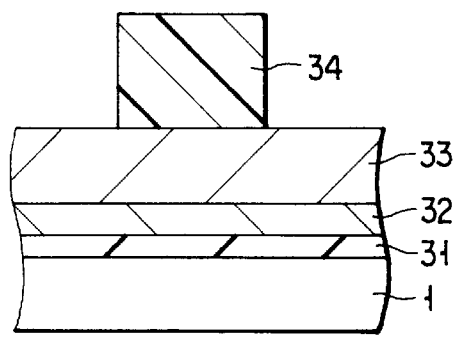

Thereafter, as shown in FIG. 14D, a photoresist 34 is coated on the polycrystalline silicon film 33 and then worked into a desired pattern by means of a photoengraving method.

Figure 14E:
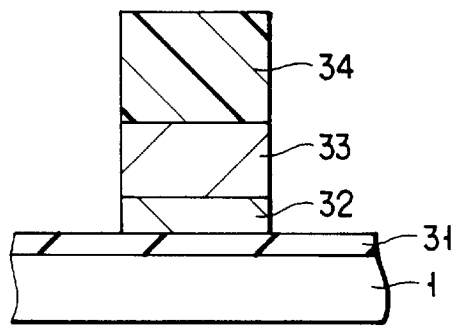

Subsequently, as shown in FIG. 14E, the polycrystalline silicon films 32 and 33 to be used as a gate electrode are successively etched perpendicularly by means of an RIE method with the photoresist 34 being employed as a mask. In this case, at the occasion of etching the polycrystalline silicon film 32, the silicon dioxide film 31 acts as an etching stopper.

Figure 14F:
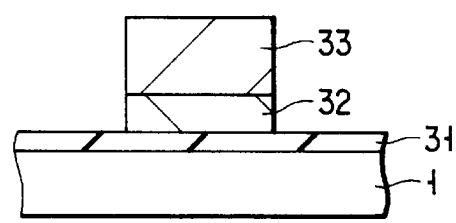
Figure 14G:
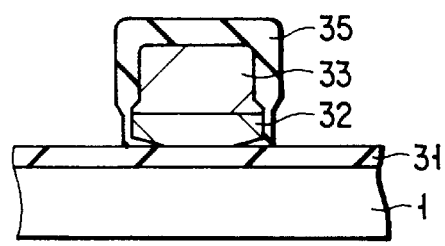

Thereafter, the photoresist 34 is removed as shown in FIG. 14F. Then, as shown in FIG. 14G, a silicon dioxide film 35 representing a post-oxide film is formed by means of a thermal oxidation method thereby to obtain the gate portion of the MOSFET.

Since the oxidation rate of the polycrystalline silicon film 32 containing nitrogen and phosphorus is slow, the silicon dioxide film can be inhibited from being increased in film thickness at the gate terminal of the silicon dioxide film 31 during the post-oxidation process thereof.

Additionally, since the growth of crystal grain of the polycrystalline silicon can be suppressed in the polycrystalline silicon film 32, the silicon dioxide film 31 can be prevented from being degraded.

Although the polycrystalline silicon film 32 doped with nitrogen is formed by means of the LPCVD method in this embodiment, this invention is not limited to such a case. Namely, nitrogen may be introduced into the polycrystalline silicon by means of an ion-implantation or by heat-treating the polycrystalline silicon in an ammonia atmosphere.

According to this embodiment, although nitrogen is added to a polycrystalline silicon film, it is also possible to obtain almost the same effect by adding nitrogen to an amorphous silicon film. In this case, an amorphous silicon film can be formed instead of a polycrystalline silicon film by lowering the deposition temperature in the LPCVD method.

In the aforementioned first to third examples, although phosphorus is doped, in view of assuring electric conductivity, in the film containing silicon and nitrogen having an oxidation inhibition effect, this invention is not confined to that, i.e. arsenic may be employed as a dopant. If arsenic is to be doped, the concentration of arsenic should preferably be in the range of $1\times10^{21}$ to $5\times10^{21}$ atom/cm$^3$ for instance.

As explained above, it is possible according to this invention to perform a post-oxidation without accompanying an increase in film thickness of the inter-poly insulator film or of the gate insulator film. Therefore, the film thickness of the inter-poly insulator film and the gate insulator film can be minimized, whereby improving the performance of the memory cell and the MOS transistor and also improving the yield and reliability of these devices.

According to this invention, the generation of leak current can be sufficiently suppressed even if an SiN film is employed for the inter-poly insulator film of the memory cell. Therefore, it is possible to work en bloc the gate of the memory cell and the gate of the peripheral circuit MOS transistor, and hence the number of step can be decreased, thus saving the manufacturing cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising;
   a semiconductor substrate;
   a first gate insulator film formed on said semiconductor substrate;
   a first gate electrode formed on said first gate insulator film;
   a second insulator film formed on said first gate electrode and formed of a three-layer structure comprising a silicon dioxide film, a silicon nitride film and a silicon dioxide film;
   a second gate electrode formed on said second insulator film; and
   a silicon film doped with nitrogen and an impurity, and interposed between said first gate electrode and said second gate insulator film and/or between said second gate insulator film and said second gate electrode.

2. The semiconductor device according to claim 1, wherein said silicon film contains nitrogen at a concentration of $5 \times 10^{18}$ to $5 \times 10^{21}$ atom/cm$^3$.

3. The semiconductor device according to claim 2, wherein said silicon film contains nitrogen at a concentration of $1 \times 10^{21}$ to $5 \times 10^{21}$ atom/cm$^3$ and an impurity at a concentration of $1 \times 10^{20}$ to $1 \times 10^{21}$ atom/cm$^3$.

4. The semiconductor device according to claim 1, wherein said impurity is at least one kind of impurities selected from the group consisting of phosphorus and arsenic.

5. The semiconductor device according to claim 1, wherein said silicon film has a film thickness of not less than 3 nm.

6. The semiconductor device according to claim 1, wherein said silicon film is formed between said first gate electrode and said second gate insulator film, and between said second gate insulator film and said second gate electrode.

7. A semiconductor device comprising;
   a semiconductor substrate;
   a first gate insulator film formed on said semiconductor substrate;
   a first gate electrode formed on said first gate insulator film;
   a second insulator film formed on said first gate electrode and formed of a silicon nitride film;
   a second gate electrode formed on said second insulator film; and
   a silicon film doped with nitrogen and an impurity, and interposed between said first gate electrode and said second gate insulator film.

8. The semiconductor device according to claim 7, wherein said silicon film contains nitrogen at a concentration of $5 \times 10^{18}$ to $5 \times 10^{21}$ atom/cm$^3$.

9. The semiconductor device according to claim 8, wherein said silicon film contains nitrogen at a concentration of $1 \times 10^{21}$ to $5 \times 10^{21}$ atom/cm$^3$ and an impurity at a concentration of $1 \times 10^{20}$ to $1 \times 10^{21}$ atom/cm$^3$.

10. The semiconductor device according to claim 7, wherein said impurity is at least one kind of impurities selected from the group consisting of phosphorus and arsenic.

11. The semiconductor device according to claim 7, wherein said silicon film has a film thickness of not less than 3 nm.

12. A semiconductor device comprising;
    a semiconductor substrate;
    a gate insulator film formed on said semiconductor substrate;
    a silicon film formed on said gate insulator film and doped with nitrogen and an impurity; and
    a gate electrode formed on said silicon film doped with nitrogen and an impurity.

13. The semiconductor device according to claim 12, wherein said silicon film contains nitrogen at a concentration of $5 \times 10^{18}$ to $5 \times 10^{21}$ atom/cm$^3$.

14. The semiconductor device according to claim 13, wherein said silicon film contains nitrogen at a concentration of $1 \times 10^{21}$ to $5 \times 10^{21}$ atom/cm$^3$ and an impurity at a concentration of $1 \times 10^{20}$ to $1 \times 10^{21}$ atom/cm$^3$.

15. The semiconductor device according to claim 12, wherein said impurity is at least one kind of impurities selected from the group consisting of phosphorus and arsenic.

16. The semiconductor device according to claim 12, wherein said silicon film has a film thickness of not less than 3 nm.

17. A semiconductor device comprising;
    a semiconductor substrate;
    a first gate insulator film formed on said semiconductor substrate;
    a first gate electrode formed on said first gate insulator film;
    a second insulator film formed on said first gate electrode;
    a second gate electrode formed on said second insulator film; and
    a silicon film doped with nitrogen and an impurity, and interposed between said first gate electrode and said second gate insulator film and/or between said second gate insulator film and said second gate electrode.

18. A semiconductor device comprising;
    a semiconductor substrate;
    a first gate insulator film formed on said semiconductor substrate;
    a first gate electrode formed on said first gate insulator film;
    a second insulator film formed on said first gate electrode and formed of a three-layer structure comprising a silicon dioxide film, a silicon nitride film and a silicon dioxide film;
    a second gate electrode formed on said second insulator film; and
    a silicon film doped with nitrogen and an impurity, and interposed between said first gate electrode and said second gate insulator film and/or between said second gate insulator film and said second gate electrode.

19. The semiconductor device according to claim 18, wherein said silicon film consists essentially of amorphous silicon.

* * * * *

UNITED STATES PATENT AND TRADEMARK OFFICE
CERTIFICATE OF CORRECTION

PATENT NO. : 5,880,498
DATED : March 09, 1999
INVENTOR(S) : HIDEYUKI KINOSHITA et al.

It is certified that error appears in the above-identified patent and that said Letters Patent is hereby corrected as shown below:

Claim 9, Column 15, line 57, "$5 \times 1021$ atom/cm$^3$" should read --$5 \times 10^{21}$ atom/cm$^3$--.

Claim 13, Column 16, line 15, "$5 \times 1021$ atom/cm$^3$" should read --$5 \times 10^{21}$ atom/cm$^3$--.

Signed and Sealed this

Twenty-eighth Day of December, 1999

*Attest:*

Q. TODD DICKINSON

*Attesting Officer*   *Acting Commissioner of Patents and Trademarks*